United States Patent
Down et al.

(10) Patent No.: US 6,831,466 B2
(45) Date of Patent: Dec. 14, 2004

(54) METHOD AND SYSTEM FOR SENSOR FAULT DETECTION

(75) Inventors: John Harry Down, Lanesboro, MA (US); Harry Kirk Mathews, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/874,821

(22) Filed: Jun. 5, 2001

(65) Prior Publication Data

US 2003/0020487 A1 Jan. 30, 2003

(51) Int. Cl.$^7$ .................. G01R 31/08; H01H 31/02; G05B 21/02; G05B 11/01; H02H 3/14
(52) U.S. Cl. .................. 324/555; 324/520; 324/537; 318/636; 318/767; 361/88
(58) Field of Search ................. 324/555, 520, 324/537; 318/636, 767; 361/88

(56) References Cited

U.S. PATENT DOCUMENTS

| | | | | |
|---|---|---|---|---|
| 4,303,978 A | * | 12/1981 | Shaw et al. | 701/220 |
| 4,356,440 A | * | 10/1982 | Curtiss et al. | 322/20 |
| 4,823,134 A | * | 4/1989 | James et al. | 342/359 |
| 5,136,512 A | * | 8/1992 | Le Borne | 340/970 |
| 5,296,861 A | * | 3/1994 | Knight | 342/357.11 |
| 5,610,532 A | * | 3/1997 | Smith | 324/127 |
| 5,680,409 A | * | 10/1997 | Qin et al. | 702/116 |
| 5,852,792 A | * | 12/1998 | Nielson | 244/164 |
| 6,223,544 B1 | * | 5/2001 | Seem | 236/94 |
| 6,226,321 B1 | * | 5/2001 | Michels et al. | 375/227 |
| 6,262,943 B1 | * | 7/2001 | Clarke | 367/135 |
| 6,304,194 B1 | * | 10/2001 | McKillip | 340/580 |

OTHER PUBLICATIONS

IEEE Transactions on Nuclear Science, vol. 24, No. 5, Sep.–Oct. 1988, "Microcomputer–Based Fault Detection Using Redundant Sensors," Polenta, et al.*

* cited by examiner

Primary Examiner—Anjan Deb
Assistant Examiner—John Teresinski
(74) Attorney, Agent, or Firm—Pierce Atwood; Kevin M. Farrell

(57) ABSTRACT

A system and method for controlling operation of a component include using at least two sensors arranged to sense an operating condition of the component. The system further includes a controller that controls the component in response to feedback signals output by one or more of the sensors. The controller also determines how the sensor feedback signals are to be used in controlling the component. To this end, the controller includes a model-based statistical filter for each one of the second sensors.

19 Claims, 2 Drawing Sheets

METHOD AND SYSTEM FOR SENSOR FAULT DETECTION

BACKGROUND OF THE INVENTION

This invention relates generally to sensor fault detection and more particularly to sensor fault detection in redundant sensor feedback control systems.

Many engineering systems use sensors to monitor and control the operation of the system. That is, the sensors are used to measure one or more system variables such as speed, temperature, pressure and the like. The sensor outputs are then used as feedback in a closed-loop operation to ensure that the system is being operated at the desired conditions, that safety bounds are being observed, and that performance is being optimized.

Although sensors are generally designed to be robust, sensor failure is still a possibility that is often addressed through use of redundant sensors. In such redundant sensor systems, control logic is used to determine which sensor output is used in the feedback loop. Current selection schemes do not fully consider the expected system response relative to command inputs. They also fail to adequately detect certain failure signatures of the sensors in some instances. These failure modes are characterized by either intermittent noise bursts, which occur at levels too small to detect currently, and/or slow gain changes (e.g., drift), which are not observable with current selection schemes. Furthermore, current selection schemes tend to use very complex algorithms comprising multiple layers of logic.

It would be desirable, therefore, to provide a redundant-sensor, feedback control system that considers expected system response and has a sensor selection scheme that can better detect noise burst and gain drift failures in the sensors. It would further be desirable to achieve sensor selection using relatively compact logic.

BRIEF SUMMARY OF THE INVENTION

The above-mentioned need is met by the present invention, which provides a system and method for controlling operation of a component. The system includes at least two sensors that are arranged to sense an operating condition of the component and a controller that controls the component in response to feedback signals output by one or more of the sensors. The controller also determines how the sensor feedback signals are to be used in controlling the component. To this end, the controller includes a model-based statistical filter for each one of the second sensors.

The present invention and its advantages over the prior art will become apparent upon reading the following detailed description and the appended claims with reference to the accompanying drawings.

BRIEF DESCRIPTION OF THE DRAWINGS

The subject matter that is regarded as the invention is particularly pointed out and distinctly claimed in the concluding part of the specification. The invention, however, may be best understood by reference to the following description taken in conjunction with the accompanying drawing figures in which:

DETAILED DESCRIPTION OF THE INVENTION

Figure 1:
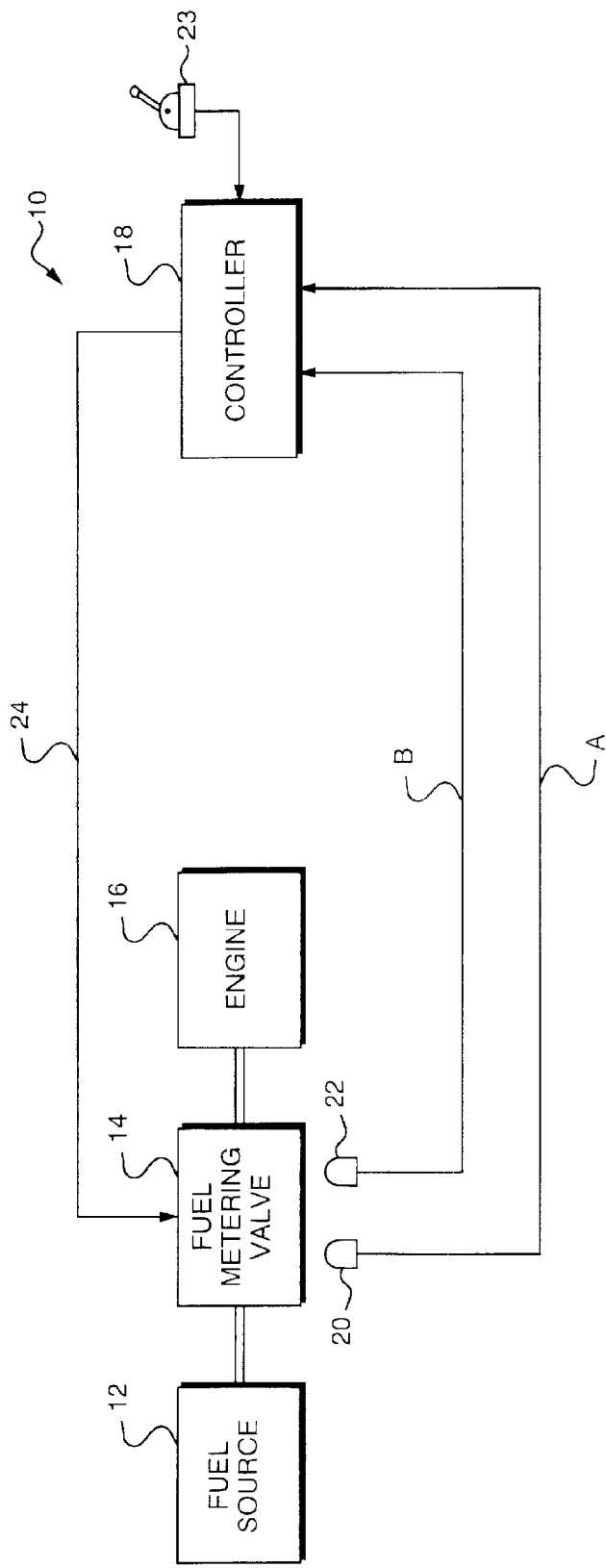
FIG. 1 is a schematic diagram of an aircraft engine fuel metering system.

Referring to the drawings wherein identical reference numerals denote the same elements throughout the various views, the present invention relates to new fault detection techniques. FIG. 1 is a schematic diagram of an aircraft engine fuel metering system 10 that utilizes the new fault detection. The system 10 is one exemplary system used to describe the present invention. However, it should be understood that the present invention is not limited to this particular system. Indeed, the present invention can be used with a wide variety of systems as will be apparent from the following description.

The system 10 includes a fuel source 12 and a fuel metering valve 14 for metering the flow of fuel from the fuel source 12 to an aircraft engine 16. The system 10 further includes an electronic engine controller 18 that controls, among other engine components, a servomotor (not shown) that opens or "positions" the fuel metering valve 14. The controller 18 is typically a full authority digital engine control (FADEC) although other controllers could be used. Dual redundant position feedback sensors 20, 22 are provided for sensing the valve position of the fuel metering valve 14 and thus the fuel flow rate. The first sensor 20 supplies a position feedback signal to the controller 18 via a first channel (channel A), and the second sensor 22 supplies a position feedback signal to the controller 18 via a second channel (channel B). The purpose for the dual sensors 20, 22 is to provide a redundancy feature; if there is a malfunction such that one sensor becomes faulted or even inoperative, then the other sensor is still available to provide feedback for controlling the fuel metering valve 14. The controller 18 also receives a desired position signal from a throttle 23 controlled by the aircraft's pilot. In response to all the inputs, the controller 18 generates a command signal 24 to operate the fuel metering valve 14 and thereby meter the flow of fuel to the engine 16.

Figure 2:
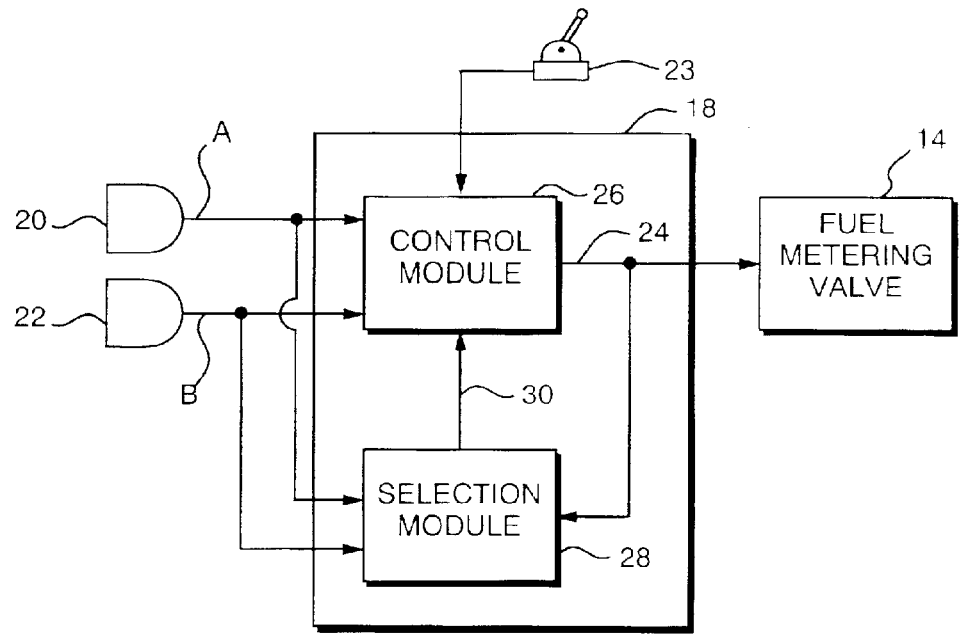
FIG. 2 is a functional block diagram of a controller from the aircraft engine fuel metering system of FIG. 1.

Referring to FIG. 2, the controller 18 comprises a control module 26 and a selection module 28. The control module 26 receives the desired position signal from the throttle 23 as well as the channel A and channel B position feedback signals from the sensors 20, 22. The control module 26 uses the desired position signal and at least one of the position feedback signals to generate the command signal 24 in a manner known to those skilled in the art. The selection module 28 also receives the channel A and channel B position feedback signals from the sensors 20, 22. In addition, the selection module 28 receives input of the command signal 24 from the control module 26. The selection module 28 processes these inputs through a dynamic system model to detect sensor faults and determine how the position feedback signals are to be used to control the fuel metering valve 14. Accordingly, the selection module 28 outputs a selection signal 30 that is fed to the control module 26 and instructs the control module 26 which position feedback signal, or weighted combination of the signals, to use in generating the command signal 24.

Figure 3:
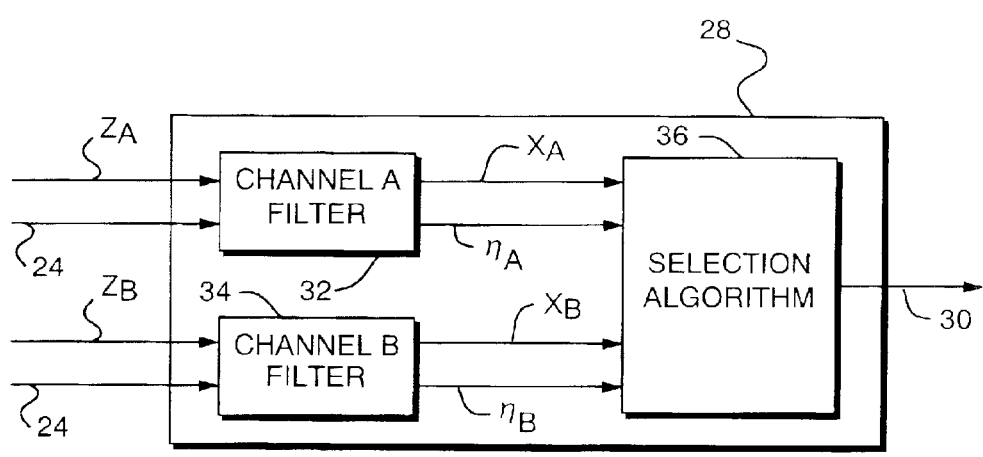
FIG. 3 is a functional block diagram of a selection module from the controller of FIG. 2.

Turning now to FIG. 3, it is seen that the selection module 28 uses a model-based statistical filter operating on each redundant position sensor channel. That is, a first filter 32 operates on channel A and a second filter 34 operates on channel B. The filters 32, 34 are based on a non-faulted sensor model where the embodied system models (which are chosen to represent the system dynamics), input command relationships and stochastic effects are the same for each filter, in that they represent expected behavior with a non-faulted position sensor. The sensor model details in each filter may differ due to known channel-to-channel variations.

In one preferred embodiment, each statistical filter 32, 34 is based on a two-state filter model constructed as a Kalman filter of the form:

$$X = \begin{bmatrix} Position(\%) \\ I_{bias}(ma) \end{bmatrix}$$

where "Position" represents the valve position (as a percentage of valve opening) of the fuel metering valve 14 and "$I_{bias}$" refers to a bias current (in milliamps) that represents error in the command signal current due to variations in the servomotor. The state variables are given by:

$$\frac{dPosition}{dt} = K_{sv} * K_{fb} * (I_{cmd} - I_{bias}) + w_1$$

$$\frac{dI_{bias}}{dt} = w_2$$

where $K_{sv}$ is the servomotor gain, $K_{fb}$ is the feedback gain, $I_{cmd}$ is the command signal current, and $w_1$ and $w_2$ are noise sequences that represent the effects of system noise and model uncertainty.

The channel A filter 32 receives the channel A position feedback signal (represented by $z_A$ in FIG. 3), and the channel B filter 34 receives the channel B position feedback signal ($z_B$). Both filters 32, 34 receive the command signal 24. In response, each filter 32, 34 generates a state estimate ($X_A$ and $X_B$, respectively) of the expected fuel metering valve position given the valve command input and a normalized measure ($\eta_A$ and $\eta_B$, respectively) of the residual error between the expected and measured values. Each filter 32, 34 updates its state estimates and residual error measurements at each sampling time DT. The sampling time DT represents the time intervals at which the state estimates and residual error measurements are generated.

Each filter 32, 34 computes an updated state estimate at every sampling time DT as follows:

$$X_i = X_{i/i-1} + K_i(z_i - HX_{i/i-1}) \quad (1)$$

where i represents the ith time interval, $K_i$ is a Kalman filter gain that varies with the time interval but can be precomputed and H is a standard observability matrix. The term $X_{i/i-1}$ is determined by the assumed system model given by:

$$X_{i/i-1} = \Phi X_{i-1} + Bu_{i-1}$$

where $\Phi$ is a state transition matrix, B is an input coupling matrix and u is the command signal 24. Equation (1) is used by both the channel A filter 32 and the channel B filter 34 to determine the state estimates $X_A$ and $X_B$, respectively, at each sampling time DT.

Each filter 32, 34 also computes an updated normalized residual error measurement at every sampling time DT as follows:

$$\eta_i = (z_i - HX_{i/i-1})^T (HP_{i/i-1}H^T + R)^{-1} (z_i - HX_{i/i-HXi/i-1}) \quad (2)$$

where $HP_{i/i-1}H^T + R$ is a covariance term that, like the gain term $K_i$, varies with the time interval but can be precomputed. This residual error is the quantity used to ultimately determine the fault state of the sensors. Both the gain and covariance terms can be stored (in order to minimize computation requirements), or approximated by function, until steady state is reached. Equation (2) is used by both the channel A filter 32 and the channel B filter 34 to determine the residual error measurements $\eta_A$ and $\eta_B$, respectively, at each sampling time DT.

The selection module 28 includes a selection algorithm 36 that receives the state estimate $X_A$ and the residual error measurement $\eta_A$ from the channel A filter 32 and the state estimate $X_B$ and the residual error measurement $\eta_B$ from the channel B filter 34. The selection algorithm 36 processes these inputs to produce the above-mentioned selection signal 30 that instructs the control module 26 which position feedback signal from the valve position sensors 20, 22, or which weighted combination of the signals, to use in generating the command signal 24. As the residual error measurements $\eta_A$ and $\eta_B$ for each channel are computed at every sampling time DT, a sliding buffer of these residual error measurements is stored for each channel. Thus, the selection module 28 works on a sliding window of residual error measurements to reduce noise. Specifically, a sliding window sum is performed for each channel at every sampling time DT as follows:

$$S_i = \sum_{k=i-N+1}^{i} \eta_k = S_{i-1} - \eta_{i-N} + \eta_i$$

where i again represents the ith time interval and N represents the number of residual error measurement values stored for each channel. Generally, N is chosen as a trade off between the response time of the selection module (wherein a smaller number provides a quicker response time) and the accuracy of the algorithm (wherein a larger number provides greater accuracy). For one exemplary fuel metering system, a sliding buffer of approximately 50 residual error measurement values provided good results.

Once the sliding window sum $S_i$ is determined for each channel, the selection algorithm 36 determines the channel with the minimum sum. The valve position sensor corresponding to the channel with the minimum sum is the sensor (referred to as the active sensor) most likely to be fault free. Accordingly, the selection algorithm 36 outputs a selection signal 30 that instructs the control module 26 to use the position feedback signal from the active position sensor in generating the command signal 24. By selecting the position feedback signal ($z_A$ or $z_B$) from the sensor most likely to be fault free, the selection module 28 ensures that the most valid valve position data is used in the control loop feedback. Alternatively, the selection module 28 could instruct the control module 26 to generate the command signal 24 using a weighted sum of the two position feedback signals $z_A$ and $z_B$. In which case, the position feedback signals $z_A$ and $z_B$ would be weighted in accordance with the corresponding values of the residual error measurements $\eta_A$ and $\eta_B$ In either event, the state estimates of the valve position are not used as loop feedback, the selected or weighted position feedback signals are.

The present invention presents a number of advantages over prior selection schemes. One advantage is that a single model is used for each channel. This is in contrast to schemes that use multiple models, such as a non-faulted model and some number of specific faulted models, on each channel. The result is a more compact approach to sensor selection that is easier to implement. In addition, the present invention can detect sensor errors, such as noise bursts and gain drift, which are not often not detected by current selection schemes. The present invention is also able to detect inconsistencies of the expected system response relative to the command inputs. The residual error measurements, which represent the difference between the expected and measured fuel metering valve positions, normally have a zero time-averaged mean value. Thus, a significant mean shift means the system 10 has diverged from the model, indicating a fault in one or more of the system components.

The foregoing has described a redundant-sensor feedback control system in which the sensor selection scheme uses model-based statistical filters to determine how output from the redundant sensors is to be used in controlling the system. While specific embodiments of the present invention have been described, it will be apparent to those skilled in the art that various modifications thereto can be made without departing from the spirit and scope of the invention as defined in the appended claims.

What is claimed is:

1. A system for controlling operation of a component, said system comprising:
   at least two sensors arranged to sense an operating condition of said component, wherein each one of said at least two sensors produces a feedback signal representative of said component operating condition;
   means for generating a command signal for controlling said component in response to output from one or more of said at least two sensors; and
   a selection module connected to receive output from said at least two sensors and to receive said command signal, said selection module using said command signal and said output from said at least two sensors to produce a selection signal that is fed to said means for generating for determining how output from said at least two sensors is to be used in controlling said component, and wherein said selection module includes means for selecting a weighted combination of said feedback signals to use for controlling said component.

2. The system of claim 1 wherein said selection module includes a model-based statistical filter for each one of said at least two sensors.

3. The system of claim 2 wherein each filter generates residual error measurements between expected values of said component operating condition and corresponding measured values of said component operating condition.

4. The system of claim 3 wherein said selection module uses said residual error measurements to determine how output from said at least two sensors is to be used in controlling said component.

5. The system of claim 1 wherein said selection module includes means for selecting one of said feedback signals to use for controlling said component.

6. The system of claim 5 wherein said means for selecting uses a sliding window of residual error measurements in selecting said one feedback signal.

7. The system of claim 1 wherein said means for selecting uses a sliding window of residual error measurements in selecting said weighted combination of said feedback signals.

8. A system for controlling operation of a component, said system comprising:
   a first sensor for providing a first feedback signal representative of an operating condition of said component;
   a second sensor for providing a second feedback signal representative of said component operating condition;
   a control module connected to receive said first and second feedback signals, said control module generating a command signal for controlling said component in response to one or both of said first and second feedback signals; end
   a selection module connected to receive said feedback signals and said command signal, said selection module using said feedback signals and said command signal to determine how said first and second feedback signals are to be used in controlling said component, said selection module including a model-based statistical filter for each one of said first and second sensors, wherein each filter generates state estimates of expected values of said component operating condition and residual error measurements between said expected values and corresponding measured values of said component operating condition and wherein said selection module includes means for selecting a weighted combination of said first and second feedback signals to use for controlling said component.

9. The system of claim 8 wherein said selection module uses said residual error measurements to determine how said first and second sensors are to be used in controlling said component.

10. The system of claim 8 wherein said selection module includes means for selecting one of said first and second feedback signals to use for controlling said component.

11. The system of claim 10 wherein said means for selecting uses a sliding window of residual error measurements in selecting said one feedback signal.

12. The system of claim 8 wherein said means for selecting uses a sliding window of residual error measurements in selecting said weighted combination of said first and second feedback signals.

13. A method for controlling operation of a component, said method comprising the steps of:
   using at least two sensors to redundantly sense an operating condition of said component, wherein each one of said at least two sensors produces a feedback signal representative of said component operating condition;
   generating a command signal for controlling said component in response to output from one or more of said at least two sensors;
   using output from said at least two sensors and said command signal to produce a selection signal that determines how output from said at least two sensors is to be used in controlling said component, wherein determining component includes selecting a weighted combination of said feedback signals to use for controlling said component; and
   using said command signal to control said component.

14. The method of claim 13 wherein a model-based statistical filter for each one of said at least two sensors is used to determine how output from said at least two sensors is to be used in controlling said component.

15. The method of claim 14 wherein each filter generates residual error measurements between expected values of said component operating condition and corresponding measured values of said component operating condition.

16. The method of claim 15 wherein said residual error measurements are used to determine how output from said at least two sensors is to be used in controlling said component.

17. The method of claim 13 wherein determining how output from said at least two sensors is to be used in controlling said component includes selecting one of said feedback signals to use for controlling said component.

18. The method of claim 17 further comprising using a sliding window of residual error measurements in selecting said one feedback signal.

19. The method of claim 13 further comprising using a sliding window of residual error measurements in selecting said weighted combination of said feedback signals.

\* \* \* \* \*

UNITED STATES PATENT AND TRADEMARK OFFICE
CERTIFICATE OF CORRECTION

PATENT NO. : 6,831,466 B2
DATED : December 14, 2004
INVENTOR(S) : John Harry Down and Harry Kirk Matthews It is certified that error appears in the above-identified patent and that said Letters Patent is hereby corrected as shown below:

Column 5,
Line 67, delete "end" and substitute therefor -- and --.

Column 6,
Line 41, after "determining" add -- how output from said at least two sensors is to be used in controlling said --.

Signed and Sealed this

Twelfth Day of April, 2005

JON W. DUDAS
*Director of the United States Patent and Trademark Office*